(12) United States Patent
Tamitani

(10) Patent No.: US 6,423,177 B1
(45) Date of Patent: Jul. 23, 2002

(54) APPARATUS FOR PERFORMING PLASMA PROCESS ON PARTICLES

(75) Inventor: Naoki Tamitani, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/497,140

(22) Filed: Feb. 3, 2000

(30) Foreign Application Priority Data

Feb. 4, 1999 (JP) ............................................. 11-027665

(51) Int. Cl.⁷ ............................. C23F 1/02; C23C 16/00
(52) U.S. Cl. ................................. 156/345.48; 118/723 I
(58) Field of Search ........................ 156/345; 118/723 I, 118/723 IR, 723 AN

(56) References Cited

U.S. PATENT DOCUMENTS

| | | | | |
|---|---|---|---|---|
| 4,918,031 A | * | 4/1990 | Flamm et al. | 437/225 |
| 5,234,529 A | * | 8/1993 | Johson | 156/345 |
| 5,720,846 A | * | 2/1998 | Yi | 156/345 |
| 6,055,928 A | * | 5/2000 | Murzin et al. | 118/723 E |

\* cited by examiner

*Primary Examiner*—Gregory Mills
*Assistant Examiner*—Luz Alejandro
(74) *Attorney, Agent, or Firm*—Rader, Fishman & Grauer PLLC; Ronald P. Kananen, Esq.

(57) ABSTRACT

The disclosure relates to a method and apparatus capable of certainly performing a plasma process such as isotropic plasma etching on the whole surface of a particle. A particle (2) is passed through a passage (3) in which inductive coupled plasma is generated and a plasma process is performed on the particle (2). In such a manner, the plasma process on the particle (2) can be performed on the entire surface of the particle (2) in a non-contact manner.

14 Claims, 4 Drawing Sheets

APPARATUS FOR PERFORMING PLASMA PROCESS ON PARTICLES

BACKGROUND OF THE INVENTION

1. Technical Field

The present invention relates to a method and apparatus for performing a plasma process on particles and, more particularly, to a plasma processing method and apparatus of a plasma process such as dry etching suitable for manufacture of a semiconductor device such as a semiconductor integrated circuit device in which semiconductor elements are formed on a very small particle such as a spherical semiconductor.

2. Description of the Related Art

In an ordinary single semiconductor device or a semiconductor device such as a semiconductor integrated circuit and the like, a semiconductor device or a semiconductor integrated circuit is formed on a plate-shaped semiconductor wafer or semiconductor chip. In the case of the configuration, however, high costs of the semiconductor device and a fabrication line are an issue.

On the other hand, recently, as shown in FIG. 5, in place of the plate-shaped semiconductor wafer or semiconductor chip, a technique of configuring a semiconductor integrated circuit on which semiconductor devices 32 are formed on the surface of a spherical semiconductor 31 that is a silicon single crystal has been proposed.

This has been achieved since there is an advantage that the surface area to the volume of the semiconductor is larger as compared with the plate-shaped semiconductor device and the spherical semiconductor chip is easier to mount on a wiring board or the like.

In the case of fabricating a semiconductor device by using such a spherical semiconductor, a processing step such as etching and the like is necessary. It is requested to smoothly perform the process such as etching on almost the whole surface of the spherical semiconductor without continuous stop in order to raise the throughput and without any contact with other things so as not to cause scratches and a mechanical damage which deteriorates the yield.

SUMMARY OF THE INVENTION

It is an object of the invention to provide a method and apparatus for performing a plasma process on particles, capable of certainly performing a plasma process especially such as isotropic plasma etching and the like on the whole or entire surface of a particle.

According to the method of the invention, a plasma process is performed on particles by passing the particles through a passage in which an inductive coupled plasma is generated.

According to the invention, an apparatus for performing a plasma process on particles comprises a passage of particles and plasma generating means for generating an inductive coupled plasma in the passage and performs the plasma process on the particles by passing the particles through the plasma.

As described above, in the plasma processing method according to the invention, the particles as members to be subjected to the plasma process are passed through a plasma, especially, an inductive coupled plasma, that is, a plasma in which activated species activated by a sufficiently large amount of energy exist at high density. Consequently, the plasma process can be certainly performed almost on the entire surface of the particle during the passage.

The plasma processing apparatus according to the invention generates a standing wave plasma by simply passing a current to a coil and therefore can perform an efficient plasma process.

DETAILED DESCRIPTION OF THE PREFERRED EMBODIMENT

An embodiment of a method of performing a plasma process on particles according to the invention relates to plasma dry etching which can be applied to etching performed on a particle itself such as a semiconductor particle itself made of Si or the like, a metal film such as an Al film formed on the surface of the particle, an insulating film made of $SiO_2$, $Si_3N_4$, or the like, and further a photoresist layer constituting a mask of the etching.

An embodiment of an apparatus for performing a plasma process on a particle according to the invention relates to an apparatus for performing a plasma process such as the dry etching.

Figure 1:
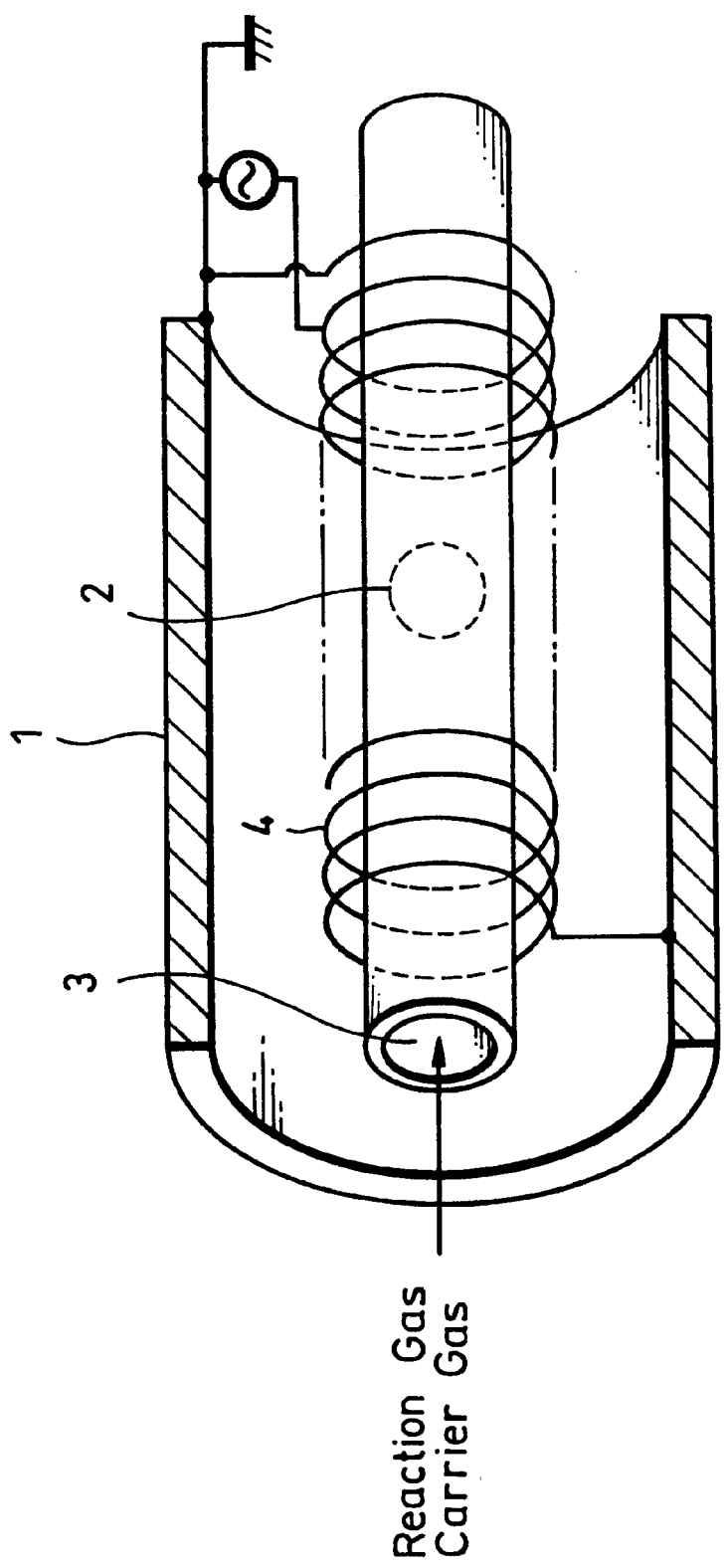
FIG. 1 is a partial cross sectional schematic perspective view of an example of a plasma processing apparatus according to the invention.

First, an embodiment of the apparatus for performing a plasma process on a particle according to the invention will be described. FIG. 1 is a partial cross sectional schematic diagram of an example of the plasma processing apparatus.

In this case, for example, a conductive cylindrical body 1 made of Al, SUS (stainless steel) or the like as a component of a resonance reactor is provided. In the conductive cylindrical body 1, a passage 3 of particles 2 which carries out a plasma process is provided axially in the conductive cylindrical body 1. For example, the passage 3 is heat resistive and is realized by a cylindrical insulating cylindrical body made of chemically stable, material for example, quartz or the like.

On the periphery of the passage 3, a conductive helical coil 4 is concentrically disposed and both ends of the coil 4 are connected to the conductive cylindrical body 1.

The inner diameter of the passage 3 is set to a value sufficiently larger than the diameter of the particle 2 passing through the passage 3, which is, for example, a value twice as large as the diameter or outer diameter of the particle 2 or larger.

In the conductive cylindrical body 1 or the resonance reactor, a surface of a high heat reflectivity for reflecting heat generated by standing waves generated by the coil 4 and/or heat generated in association with the plasma generation and the like in the passage 3 is formed. The surface of high heat reflectivity can be formed, for example, on the inside of the conductive cylindrical body 1. The surface of high heat reflectivity is formed by polishing the inside of the conductive cylindrical body 1 or a mirror surface of a high heat reflectivity formed by plating, deposition or the like of Al, Cr, or the like.

A similar surface of high heat reflectivity can be also formed on the inside of the passage 3.

In such a manner, by confining the heat of the plasma generation which will be described hereinlater or the like, the reaction with the particle 2 can be enhanced.

A high current of a predetermined wavelength such as 2 MHz, 13.56 MHz is passed to the coil 4. By selecting the number of turns and the pitch of the coil 4 and the wavelength of the current passed, a resonance state is obtained and standing waves around the axis of the coil 4 are generated. That is, as schematically shown by solid curved lines 21 and 22 in FIG. 2, what are called helicon standing waves of sinusoidal waves of the current and voltage are generated.

In this case, by producing parallel resonance with the resonance reactor realized by the conductive cylindrical body 1, clear standing waves can be generated.

Figure 2:
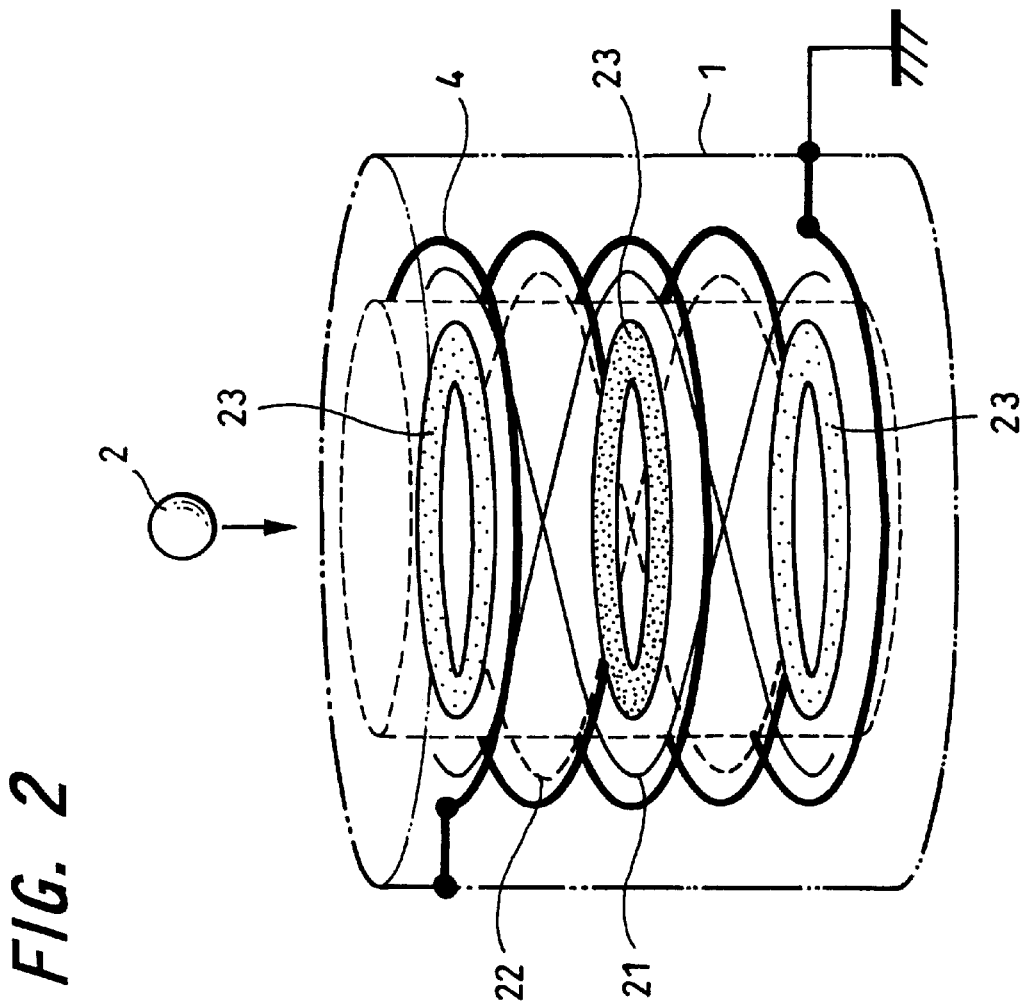
FIG. 2 is a diagram showing the configuration of the example of the plasma processing apparatus according to the invention.

The same components in FIG. 2 as those in FIG. 1 are designated by the same reference numerals and their description is omitted here.

In such a state, when a predetermined reaction gas is supplied into the passage 3, as schematically shown in FIG. 2, a ring-shaped or disc-shaped high-density plasma generation part 23 is produced.

In the method of performing the plasma process on particles according to the invention, for example, a number of particles 2 are sequentially supplied at predetermined intervals into the passage 3 in which the high-density plasma generation part 23 is produced and are allowed to pass through the plasma generation part 23, thereby performing the plasma process such as dry etching.

As shown in FIG. 1, the above-mentioned plasma processing apparatus according to the invention can be also disposed so as to be horizontally oriented, that is, the conductive cylindrical body 1, the passage 3, and the like can be disposed in the horizontal direction. In this case, a reaction gas, or a reaction gas and a carrier gas, such as Ar, N2, or the like, are supplied from the left end in FIG. 1 to the right end to thereby move the particles 2 from one end to the other end along the passage 3.

Alternatively, as shown in FIG. 2, the plasma processing apparatus can be disposed vertically, that is, the conductive cylindrical body 1, the passage 3, and the like are disposed almost in the gravity direction and the particles 2 are moved by being dropped through the passage 3 by the action of gravity. A method of supplying a gas from below to control the speed of the drop can be also used.

In any case, a plurality of particles 2 can be continuously supplied into the passage 3 at predetermined time intervals.

Figure 5:
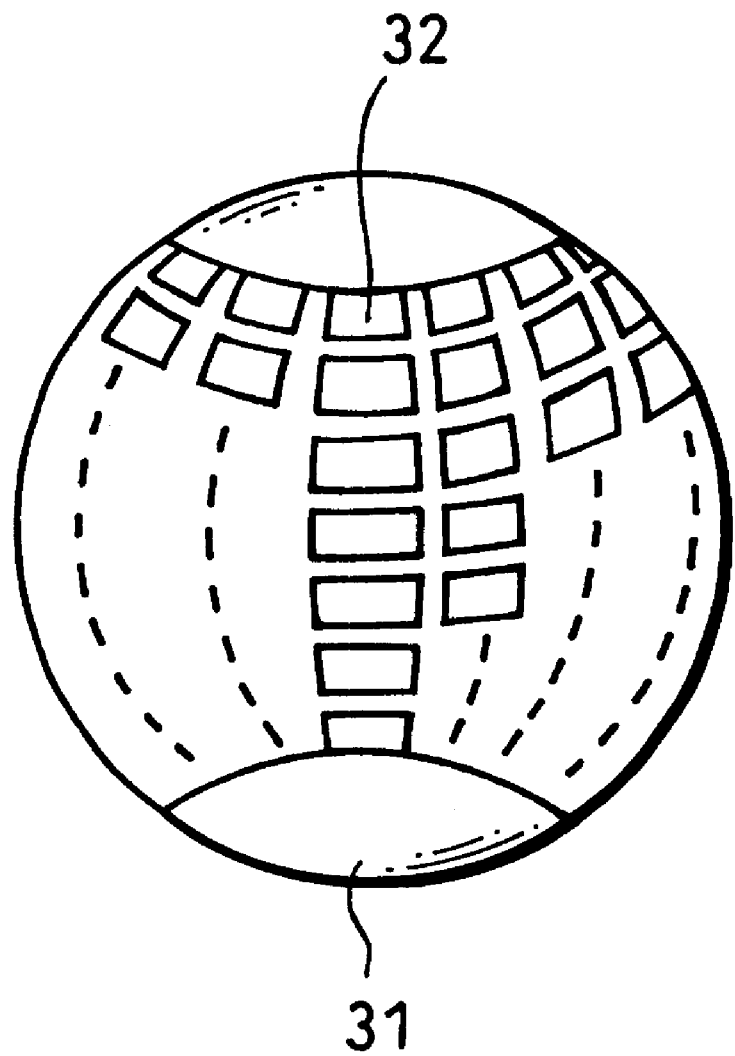
FIG. 5 is a perspective view of an example of a spherical semiconductor device.

The particle 2 is a spherical semiconductor for forming a semiconductor integrated circuit shown in FIG. 5 or the like. The plasma process on the particles according to the invention can be applied to plasma dry etching in the step of fabricating the particle.

Figure 3:
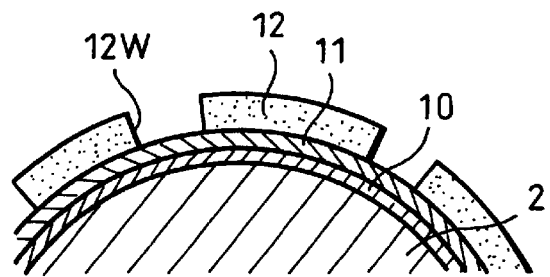
FIG. 3 is a schematic cross section of the main part of an example of a particle to which the method of the invention is applied.

As shown in the schematic cross section of the main part in FIG. 3 as an example, a case of obtaining a predetermined pattern by etching a metal film 11, made of Al or the like, deposited on the surface of the particle 2 via an insulating film 10 made of SiO2, or the like, by photolithography, or the like, while placing a photoresist 12 of a predetermined pattern as an etching mask on the metal film 11 will be described. The particle 2 is a spherical semiconductor having a diameter of about 1 mm or a spherical semiconductor including a semiconductor layer made of Si, or the like, on its surface.

When the diameter of the particle 2 which is the spherical semiconductor to be plasma processed or etched in the example is 1 mm, the inner diameter of the passage 3 can be determined to be about 2 to 3 mm.

The air in the conductive cylindrical body 1 is exhausted to produce a high vacuum by a high vacuum pump (not shown) and a high-frequency current is passed to the coil 4. On the other hand, for example, a reaction gas, such as Cl2 gas, of a flow rate of 2000 sccm and an Ar gas of a flow rate of 100 sccm are supplied to the passage 3. The pressure in the passage 3 is set to, for example, 200 Pa.

In such a state, the photoresist 12 is used as an etching mask and the Al film exposed to the outside through an opening 12W is dry etched, thereby forming a pattern.

Since the plasma process which is dry etching in this example is performed by making the particle 2 pass in plasma, the plasma process is performed evenly on the whole surface of the particle 2.

In the above case, the Al film is dry etched. A reaction gas similar to that used for Al can be used also in the case where an Si film is etched.

The invention can be also applied to removal of a photoresist. In this case, a gas is selected (for instance, O2 and Ar are used) according to an object to be etched.

Figure 4:
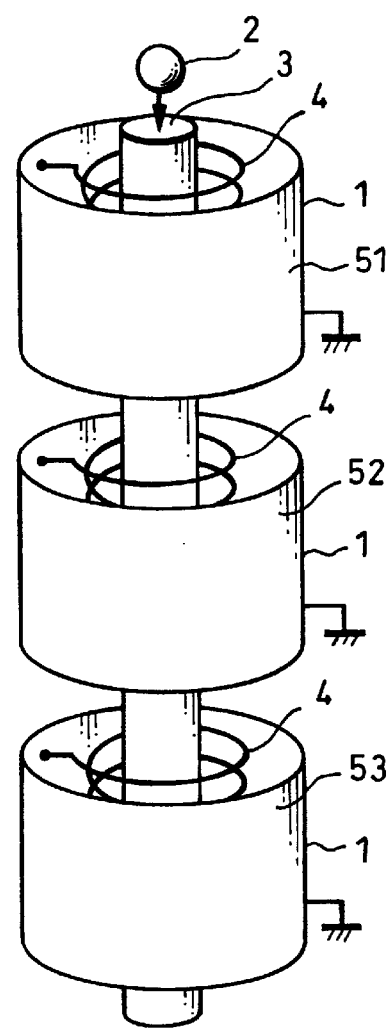
FIG. 4 is a diagram showing the configuration of an example of the plasma processing apparatus according to the invention.

The method and apparatus of the invention are not limited to the above examples. For example, as shown in FIG. 4, plasma processing apparatuses at a plurality of stages, that is, first to third plasma processing units 51 to 53 in the diagram each having the coil 4 and the conductive cylindrical body 1 can be disposed subordinately to the common passage 3.

In the plasma processing units, a plasma process such as the same plasma etching and the like can be repeatedly performed sufficiently. It is also possible to perform different plasma processes at the stages or a part of the stages to realize plasma processes of a plurality of kinds of plasma etching and the like. For example, on the particle 2 with the configuration of FIG. 3, the metal film 11 is dry etched by a plasma processing unit 51 at the first stage, the insulating film 10 is dry etched by a plasma processing unit 52 at the second stage, and the photoresist 12 is removed by a plasma etching of the plasma processing unit 53 at the third stage.

In such a manner, a series of the plasma processes can be performed without taking the particle 2 to the outside.

Although the above-mentioned embodiment relates to the case where the invention is applied to dry etching, the plasma process is not limited to dry etching, but can also be applied to, for example, plasma CVD (Chemical Vapor Deposition) and the like.

The particle 2 is not limited to a spherical semiconductor but can be also applied to a very small particle which needs to be subjected to the plasma process.

As described above, according to the method of performing the plasma process on particles, for example, by sequentially passing a number of particles through plasma, the target plasma process can be performed. Since activated species used for the plasma process can be evenly deposited on the whole surface of each particle, the process using plasma such as plasma dry etching can be certainly, evenly performed.

Since the process can be performed on the particle in a non-contact manner, the particle can be smoothly moved.

Consequently, the throughput can be improved, it can be avoided that the particle is damaged in the plasma processing step, and the yield and the reliability can be improved.

According to the plasma processing apparatus of the invention, the plasma process can be effectively performed with a simple configuration. As described above, plasma processing apparatuses at a plurality of stages can be subordinately disposed with respect to the common particle passage, so that the particle can be subject to either the same plasma process by the plasma processing units at the plurality of stages or successively different plasma processes. Consequently, the same plasma process or different plasma processes can be sufficiently, successively performed on the particle by the plasma processing units at a plurality of stages. The productivity can be therefore improved and the occupied area and space of the whole apparatus can be reduced.

Between the plasma processes, the particle avoids from being exposed to the outside air. The reliability of the semiconductor device or the like formed by using the particles can be therefore increased.

As described above, by disposing the face of high heat reflectivity on the inside of the conductive cylindrical body 1, a heat confining effect can be obtained. Consequently, the sufficiently high temperature in the passage 3 can be held and the reaction with the activated species can be promoted, so that the plasma process such as plasma etching can be efficiently performed.

According to the invention as described above, many significant industrial effects can be produced.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An apparatus for performing a plasma process on particles, comprising:
   an outer conductive body having an inner surface of high heat reflectivity;
   a passage for a particle to be plasma processed, said passage defined by an inner insulating body; and
   plasma generating means for generating inductive coupled plasma in the passage, said plasma generating means having a helical coil disposed around said passage, for generating the plasma in the passage by passing a current to the helical coil and supplying a plasma generating gas into the passage whereby the plasma process is performed on the particle;
   wherein the plasma process is performed on the particle by passing the particle through the plasma.

2. An apparatus for performing a plasma process on particles according to claim 1, wherein said outer conductive body is a resonance reactor disposed about the helical coil, thus for generating a standing wave plasma in the passage by passing a current to the helical coil, both ends of said helical coil connected to said outer conductive body.

3. An apparatus for performing a plasma process on particles according to claim 2, wherein the resonance reactor is formed by a conductive cylindrical body that is either horizontally or vertically oriented.

4. An apparatus for performing a plasma process on particles according to claim 2, wherein the resonance reactor is held in a high vacuum.

5. An apparatus for performing a plasma process on particles according to claim 1, wherein wherein said inner insulating body defines a diameter of the passage that is sufficiently larger than the diameter of the particles passing through the passage.

6. An apparatus for performing a plasma process on particles according to claim 1, wherein a surface of high heat reflectivity is formed on the inside of the inner insulating body defining the passage.

7. An apparatus for performing a plasma process on particles according to claim 1, wherein the particles are passed in a non-contact state in the passage in which inductive coupled plasma is generated.

8. An apparatus for performing a plasma process on particles according to claim 1, wherein the particle is a particle semiconductor forming a particle semiconductor device, and
   the plasma process is plasma dry etching of layers made of various materials formed on the surface in a fabricating step of the particle semiconductor device.

9. An apparatus for performing a plasma process on particles according to claim 1, wherein the passage of the particle to be subjected to the plasma process is disposed within the inner insulating cylindrical body,
   the helical coil disposed around the passage in the inner insulating cylindrical body is connected to a source of current that, in cooperation with the number of turns and the pitch of the coil and the wavelength of the current, produces standing waves around the axis of the coil.

10. An apparatus for performing a plasma process on particles, comprising:
    a conductive cylindrical body as a component of a resonance reactor and having an inner surface of high heat reflectivity;
    a passage within said conductive cylindrical body defined by a cylindrical insulating body;
    a conductive helical coil concentrically disposed about the periphery of the cylindrical insulating body defining the passage, said passage having an inner diameter sufficiently larger than the diameter of the particle passing through said passage;
    a source of current of a predetermined wavelength connected to said coil and to a source of reference potential, said helical coil being connected at its ends to said conductive cylindrical body;
    a source of reaction gas supplied to said passage for generating said plasma; and
    a source of particles, providing said particles to said passage for undergoing plasma processing.

11. The apparatus as set forth in claim 10, wherein said plasma processing apparatus is horizontally oriented.

12. The apparatus as set forth in claim 10, wherein said plasma processing apparatus is vertically oriented.

13. The apparatus as set forth in claim 10, wherein said cylindrical insulating body defining said passage further includes a surface of high heat reflectivity.

14. The apparatus as set forth in claim 10, wherein said particles are spherical semiconductors having surfaces for undergoing plasma processing within said passage.

* * * * *

UNITED STATES PATENT AND TRADEMARK OFFICE
CERTIFICATE OF CORRECTION

PATENT NO. : 6,423,177 B1
DATED : July 23, 2002
INVENTOR(S) : Naoki Tamitani

It is certified that error appears in the above-identified patent and that said Letters Patent is hereby corrected as shown below:

<u>Column 6,</u>
Line 2, replace "wherein wherein" with -- "wherein" --.

Signed and Sealed this

Fourth Day of March, 2003

JAMES E. ROGAN
*Director of the United States Patent and Trademark Office*